United States Patent
Sun et al.

(10) Patent No.: US 7,126,746 B2
(45) Date of Patent: Oct. 24, 2006

(54) GENERATING SETS OF TAILORED LASER PULSES

(75) Inventors: Yunlong Sun, Beaverton, OR (US); Robert F. Hainsey, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 156 days.

(21) Appl. No.: 10/921,765

(22) Filed: Aug. 18, 2004

(65) Prior Publication Data
US 2005/0041976 A1 Feb. 24, 2005

Related U.S. Application Data

(60) Provisional application No. 60/496,361, filed on Aug. 19, 2003.

(51) Int. Cl.
*H01S 3/00* (2006.01)
*B23K 26/04* (2006.01)

(52) U.S. Cl. ............ 359/333; 219/121.68; 219/121.69; 219/121.62

(58) Field of Classification Search ................ 359/333; 219/121.62, 121.68, 121.69
See application file for complete search history.

(56) References Cited

U.S. PATENT DOCUMENTS

| | | | | |
|---|---|---|---|---|
| 5,265,114 A | | 11/1993 | Sun et al. ...................... 372/69 |
| 5,319,195 A | * | 6/1994 | Jones et al. ............. 250/227.11 |
| 5,473,624 A | | 12/1995 | Sun .............................. 372/69 |
| 5,539,764 A | | 7/1996 | Shields .......................... 372/57 |
| 5,998,759 A | | 12/1999 | Smart ..................... 219/121.69 |
| 6,025,256 A | | 2/2000 | Swenson et al. ............. 438/601 |
| 6,057,180 A | | 5/2000 | Sun et al. .................... 438/132 |
| 6,169,014 B1 | | 1/2001 | McCulloch ................. 438/487 |
| 6,210,401 B1 | | 4/2001 | Lai ............................. 606/12 |
| 6,252,195 B1 | | 6/2001 | Mosavi et al. ......... 219/121.69 |
| 6,281,471 B1 | | 8/2001 | Smart ..................... 219/121.62 |
| 6,340,806 B1 | | 1/2002 | Smart et al. ........... 219/121.62 |
| 6,346,686 B1 | | 2/2002 | Betin et al. ............. 219/121.61 |
| 6,541,731 B1 | | 4/2003 | Mead et al. .............. 219/121.7 |
| 6,574,250 B1 | | 6/2003 | Sun et al. ...................... 372/25 |
| 6,703,582 B1 | * | 3/2004 | Smart et al. ........... 219/121.62 |
| 6,727,458 B1 | | 4/2004 | Smart ..................... 219/121.62 |
| 6,878,899 B1 | | 4/2005 | Smart ..................... 219/121.61 |
| 6,887,804 B1 | | 5/2005 | Sun et al. ..................... 438/940 |
| 2002/0167581 A1 | | 11/2002 | Cordingley et al. ......... 347/173 |
| 2003/0151053 A1 | | 8/2003 | Sun et al. ...................... 257/79 |
| 2003/0222324 A1 | | 12/2003 | Sun et al. .................... 257/431 |

(Continued)

FOREIGN PATENT DOCUMENTS

WO  WO 2004/107510 A2 * 12/2004

*Primary Examiner*—Mark Hellner
(74) *Attorney, Agent, or Firm*—Stoel Rives LLP

(57) ABSTRACT

In a master oscillator power amplifier, a driver (208) of a diode laser (202) is specially controlled to generate a set of two or more injection laser pulses that are injected into a power amplifier (204) operated in an unsaturated state to generate a set (50) of laser pulses (52) that replicate the temporal power profile of the injection laser pulses to remove a conductive link (22) and/or its overlying passivation layer (44) in a memory or other IC chip. Each set (50) includes at least one specially tailored pulse (52) and/or two or more pulses (50) having different temporal power profiles. The duration of the set (50) is short enough to be treated as a single "pulse" by conventional positioning systems (380) to perform on-the-fly link removal without stopping.

56 Claims, 8 Drawing Sheets

U.S. PATENT DOCUMENTS

| | | | |
|---|---|---|---|
| 2003/0222330 A1 | 12/2003 | Sun et al. | 257/665 |
| 2004/0134894 A1 | 7/2004 | Gu et al. | 219/121.68 |
| 2004/0134896 A1 | 7/2004 | Gu et al. | 219/121.69 |
| 2004/0188399 A1 | 9/2004 | Smart | 219/121.69 |
| 2005/0092720 A1 | 5/2005 | Gu et al. | 219/121.69 |
| 2005/0115936 A1 | 6/2005 | Gu et al. | 219/121.69 |
| 2005/0115937 A1 | 6/2005 | Gu et al. | 219/121.69 |
| 2005/0150879 A1 | 7/2005 | Gu et al. | 219/121.69 |
| 2005/0150880 A1 | 7/2005 | Gu et al. | 219/121.69 |

* cited by examiner

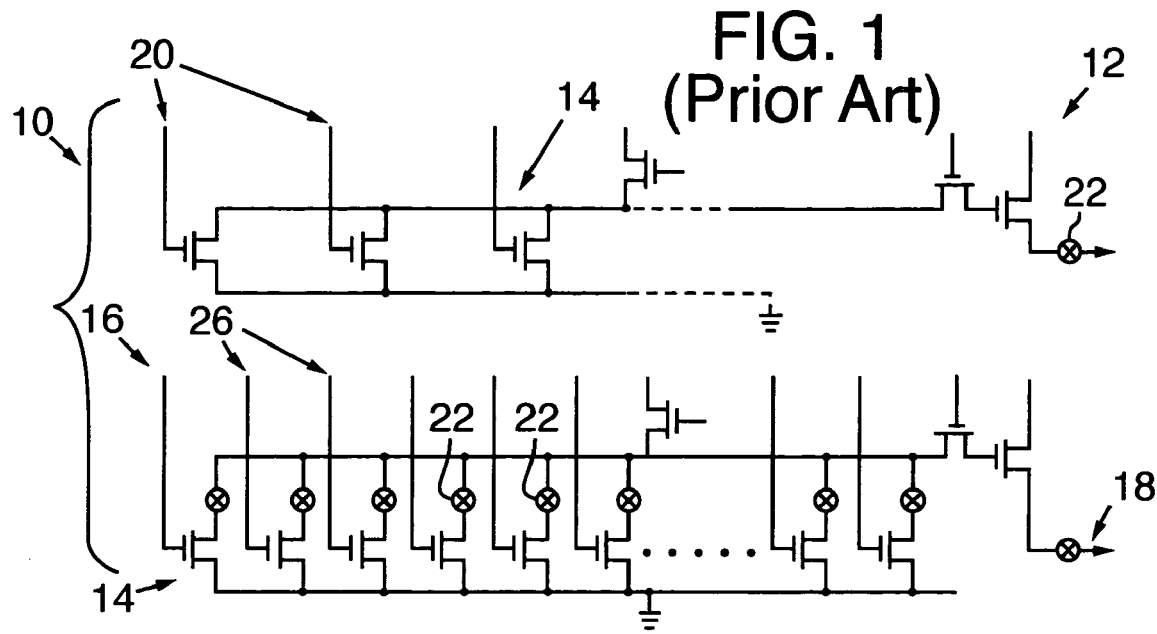
FIG. 1 (Prior Art)
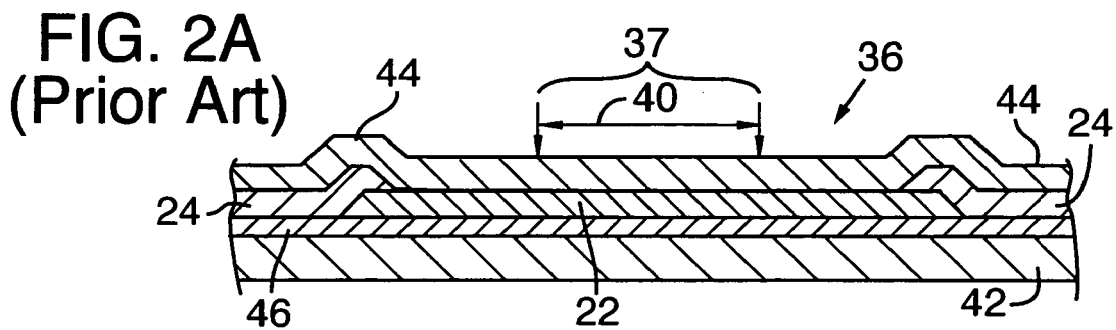
FIG. 2A (Prior Art)
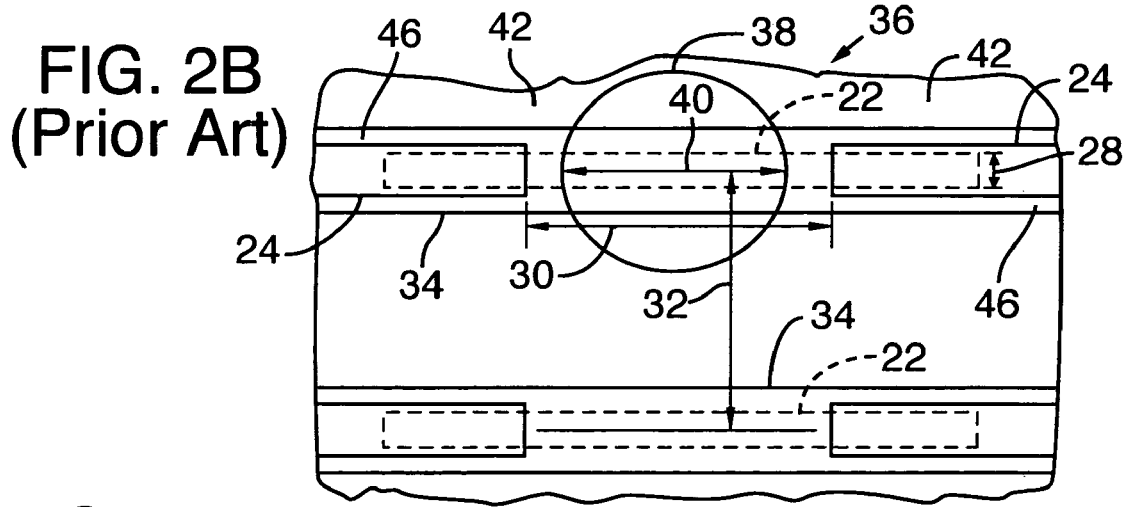
FIG. 2B (Prior Art)
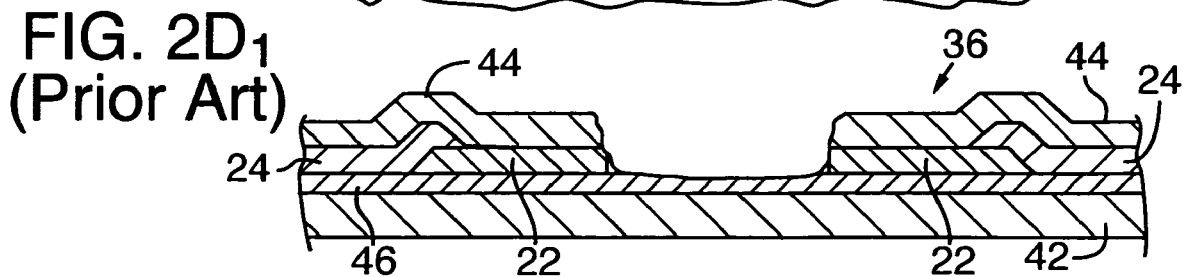
FIG. 2D$_1$ (Prior Art)

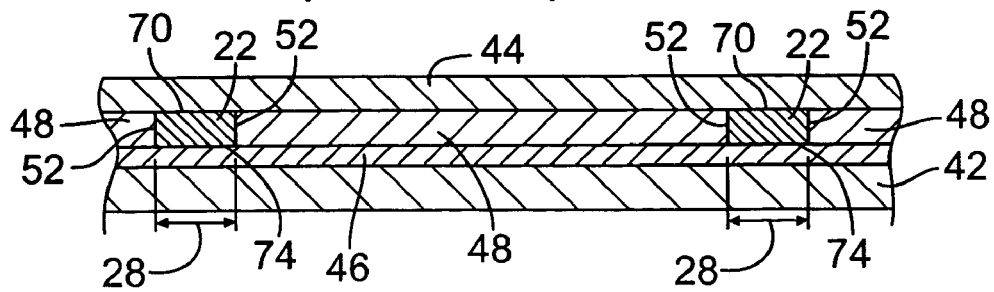
FIG. 2C (Prior Art)
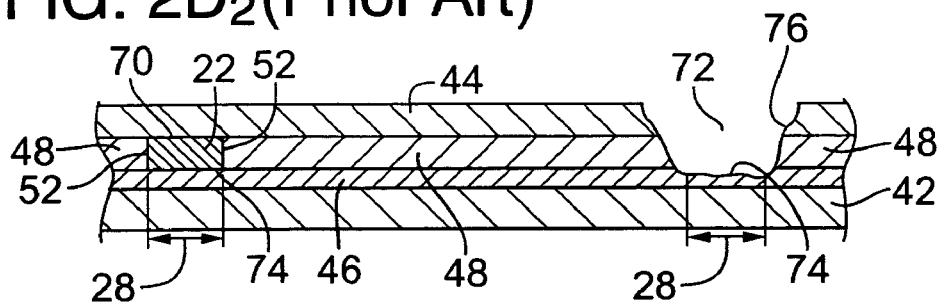
FIG. 2D$_2$ (Prior Art)
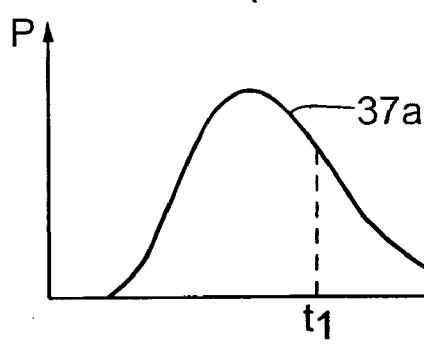
FIG. 3A (Prior Art)
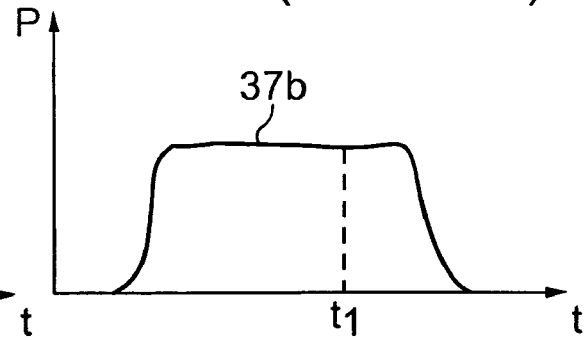
FIG. 3B (Prior Art)
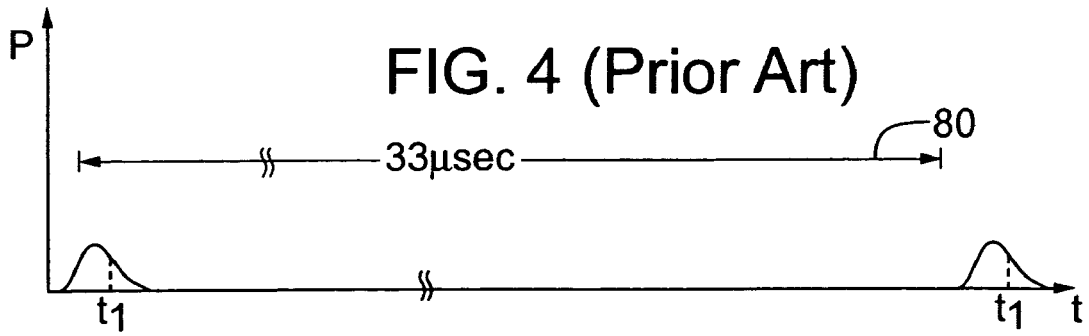
FIG. 4 (Prior Art)

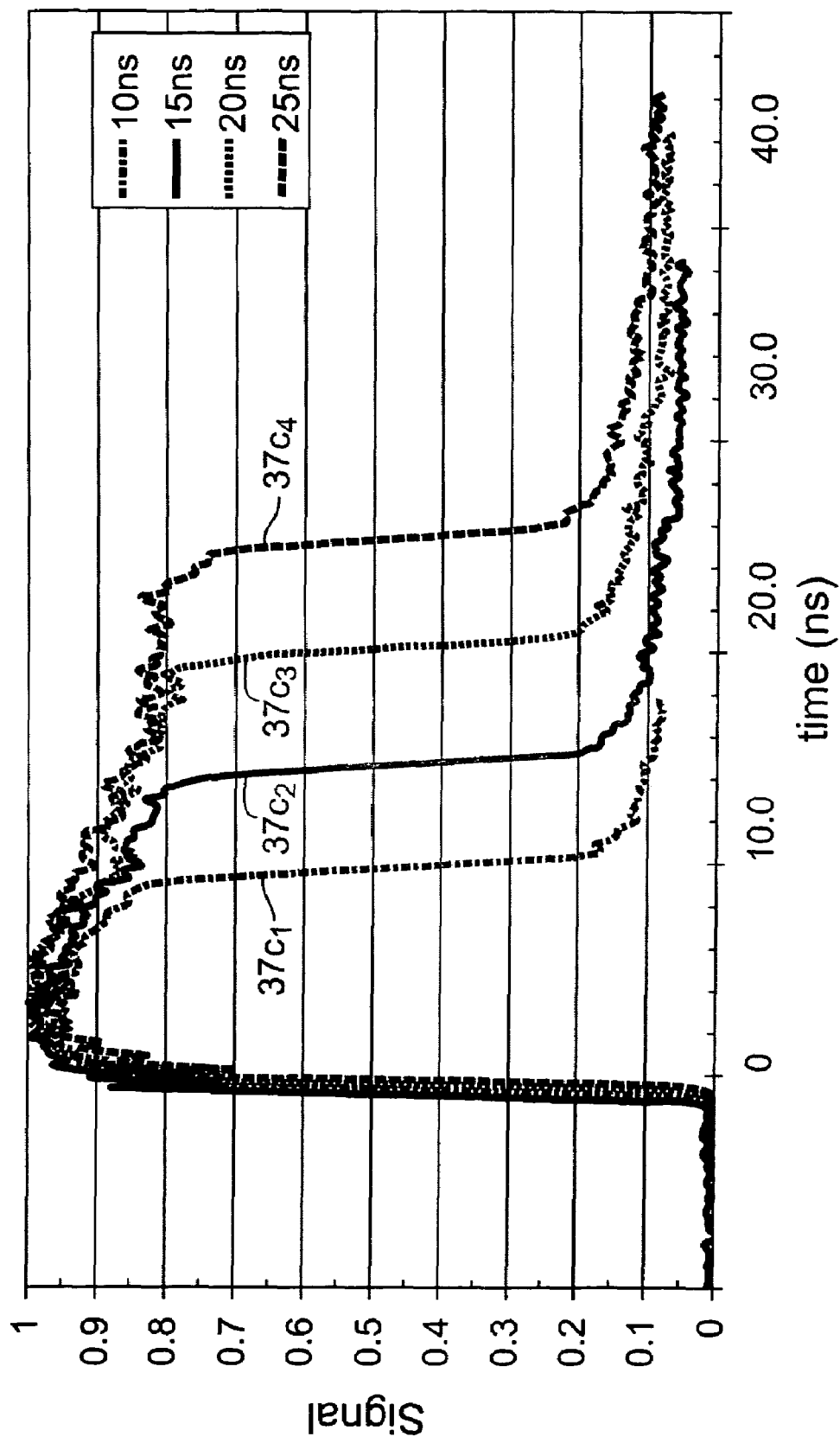

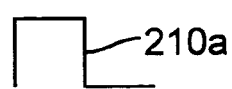 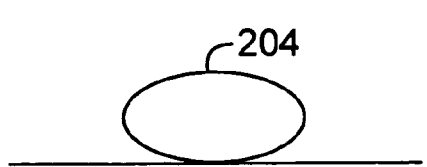
FIG. 6B₁
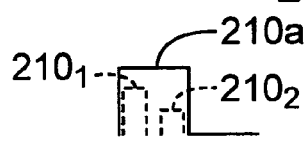 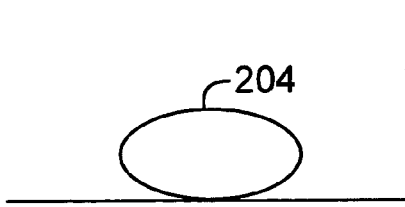 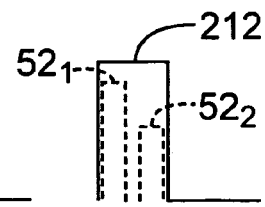
FIG. 6B₂
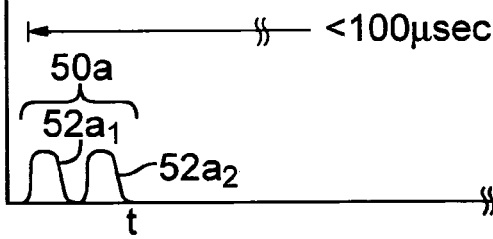
FIG. 7A
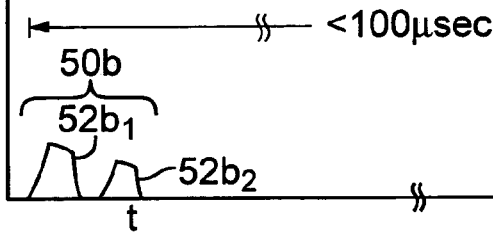
FIG. 7B
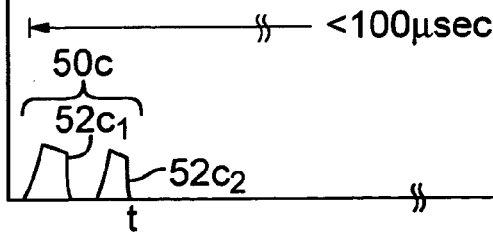
FIG. 7C

GENERATING SETS OF TAILORED LASER PULSES

RELATED APPLICATIONS

This patent application claims benefit of U.S. Provisional Application No. 60/496,631, filed Aug. 19, 2003.

COPYRIGHT NOTICE

© 2004 Electro Scientific Industries, Inc. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

1. Technical Field

The present invention relates to laser processing of conductive links on memory chips or other integrated circuit (IC) chips and, in particular, to methods and systems employing a master oscillator power amplifier to generate sets of at least two laser pulses to sever such links with better processing quality on-the-fly.

2. Background of the Invention

Decreased yields in IC device fabrication processes often result from defects caused by misalignment of subsurface layers or patterns or by particulate contaminants. FIGS. 1, 2A, and 2B show repetitive electronic circuits 10 of an IC device or work piece 12 that are commonly fabricated in rows or columns to include multiple iterations of redundant circuit elements 14, such as spare rows 16 and columns 18 of memory cells 20. With reference to FIGS. 1, 2A, and 2B, circuits 10 are designed to include between electrical contacts 24 laser severable conductive links 22 that can be removed to disconnect a defective memory cell 20, for example, and substitute a replacement redundant cell 26 in a memory device such as a DRAM, an SRAM, or an embedded memory. Similar techniques are also used to sever links 22 to repair CCD imaging devices or to program logic products, gate arrays, or ASICs.

The links 22 in link structure 36 are about 0.3 micron (μm)–2 μm thick and are designed with conventional link widths 28 of about 0.4 μm–2.5 μm, link lengths 30 between adjacent electrical contacts 24, and element-to-element pitches (center-to-center spacings) 32 of about 2 μm–8 μm from adjacent circuit structures or elements 34. Although the most commonly used link materials have been polysilicon, polycide, and like compositions, memory manufacturers have more recently adopted a variety of more electrically conductive metallic link materials that may include, but are not limited to, aluminum, chromide, copper, gold, nickel, nickel chromide, titanium, tungsten, platinum, as well as other metals, metal alloys, metal nitrides such as titanium or tantalum nitride, metal suicides such as disilicide, tungsten silicide, or other metal-like materials.

Electronic circuits 10, circuit elements 14, or memory cells 20 are tested for defects, the locations of which may be mapped into a database or program. Traditional 1.047 μm or 1.064 μm infrared (IR) laser wavelengths have been employed for more than 20 years to explosively remove conductive links 22. Conventional memory link processing systems focus at a selected link 22 a single laser output pulse 37 having a pulse width of about 4 nanoseconds (ns) to 30 ns. FIGS. 2A and 2B show a laser spot 38 of spot size (area or diameter) 40 impinging a link structure 36 composed of a polysilicon or metal link 22 positioned above a silicon substrate 42 and between component layers of a passivation layer stack including an overlying passivation layer 44 (shown in FIG. 2A), which is typically 500 Å–10,000 Å thick, and an underlying passivation layer 46. FIG. 2C shows two adjacent links 22 separated by an intermediate passivation layer 48. Each of links 22 has opposite side surfaces 52 separated by a distance that defines a nominal link width 28, which laser spot 38 encompasses to sever link 22. Silicon substrate 42 absorbs a relatively small proportional quantity of IR laser radiation, and conventional passivation layers 44, 46, and 48 such as silicon dioxide or silicon nitride are relatively transparent to IR laser radiation. The links 22 are typically processed "on-the-fly" such that the beam positioning system does not have to stop moving when a laser pulse is fired at a selected link 22, with each selected link 22 being processed by a single laser pulse. The on-the-fly process facilitates a very high link-processing throughput, such as processing several tens of thousands of links 22 per second.

FIG. $2D_1$ and FIG. $2D_2$ are a fragmentary cross-sectional views of the link structure of FIG. 2B after removal of link 22 by the prior art laser pulse. FIG. $2D_2$ shows an irregularly curved line 76 passing through portions of passivation layers 44, 46, and 48 surrounding the open area previously occupied by removed link 22. Curved line 76 represents typical damage to the passivation structure, specifically damage that extends by a certain amount, e.g., about 0.5 micron, from the region previously occupied by the link or becomes quite visible under a microscope. Typical damage also includes cracks in the passivation structure, which are not shown in the drawing figures.

To avoid damage to the substrate 42 while maintaining sufficient laser energy to process a metal or nonmetal link 22, Sun et al. in U.S. Pat. Nos. 5,265,114 and 5,473,624 describe using a single 9 ns to 25 ns laser pulse at a longer laser wavelength, such as 1.3 μm, to process memory links 22 on silicon wafers. At the 1.3 μm wavelength, the laser energy absorption contrast between the link material 22 and silicon substrate 42 is much larger than that at the traditional 1 μm laser wavelengths. The much wider laser processing window and better processing quality afforded by this technique has been used in the industry for about five years with great success.

U.S. Pat. No. 6,057,180 of Sun et al. describes a method of using ultraviolet (UV) laser output to sever links. Shorter laser wavelengths are employed to deliver a smaller laser beam spot size to accommodate the ever-shrinking link dimensions and link-to-link pitch sizes. These shorter laser wavelengths also provide better coupling of the laser energy into the link target material to facilitate the process. However, removal of the link itself by such a UV laser pulse entails careful consideration of the underlying passivation structure and material to protect the underlying passivation and silicon wafer from damage by the UV laser pulse.

FIG. 3A is the typical temporal shape of a traditional laser pulse 37a at wavelengths of 1 μm and 1.3 μm used in the link processing. To more effectively use the laser energy, Smart et al. in U.S. Pat. Nos. 6,281,471 and 6,340,806 propose using a master oscillator power amplifier to provide (MOPA) laser pulses 37b of temporal shape shown in FIG. 3B with substantially square temporal power density distributions to process the links.

MOPA lasers are generally CW-pumped, doped and grated fiber lasants that are activated by an injection laser at a high uniform repetition rate, such as 30 kHz. MOPA configured lasers manufactured by IMRA, America, Inc., Fremont, Calif. provide substantially square shaped pulses 37*b* that have an adjustable pulse width of 5–20 ns.

According to Smart et al., the rise time of the laser pulse has to be shorter than 1 ns, the flatness of the squared wave top has to be better than 10%, and the fall time has to be sufficiently short. The stated advantage of using laser pulses with the temporal shape shown in FIG. 3B was that the sharp rise time of the laser pulse would deliver thermal shock to the overlying layer of oxides and thereby facilitate the link blowing process. In addition, the reflectivity of the laser energy by the link at the higher power density would be reduced with the fast rising, short duration pulse. If, however, breaking the overlying passivation layer sooner with the help of a thermal shock wave delivered to the layer by the sharp rise time of the laser pulse truly facilitates the process, processing link structures with no overlying passivation layer would not have been a technical challenge. Industry practice has proved otherwise.

Because of inevitable variations of the link structure 36, such as, for example, the thickness of the overlying passivation layer 44; the thickness, width, and side wall slope of the link 22 itself; and the thickness of the underlying passivation layer 46, there is a need for some head room in the laser pulse energy used to process the links 22. Typically, the link material will be totally removed well before of the laser pulse ends. For the typical laser pulse used, the link material for the average link 22 is totally removed by time $t_1$, as shown in FIG. 3A. Some tail after $t_1$ is desirable to accommodate link variations where a few of the links 22 require a little more pulse energy in order to completely sever them. Similarly, time $t_1$ in FIG. 3B depicts the time when the typical link material is totally removed. Persons skilled in the art will realize that the laser pulse energy after time $t_1$ for both cases imposes a risk of damaging the silicon substrate 42 of some of the links 22, especially those that were completely processed well before time $t_1$, because there would be no link material remaining to shield the substrate 42 from exposure to the laser energy. The laser pulse energy after time $t_1$ imposes great risk of damaging also the neighboring structure 34 to the link 22. Unfortunately, for the traditional laser pulse 37*a*, there is no control over the temporal shape of the laser pulse 37*a* after time $t_1$. For the substantially square temporal laser pulse 37*b*, it is worse in that right after the time $t_1$ the laser pulse 37*b* will remain at its peak intensity for a while, potentially causing even greater risk of damage to the substrate 42 or neighboring structure 34.

FIG. 4 shows an exemplary typical interval 80 between sequential laser pulses 37 that are used to sever respective spaced-apart links 22. Such time interval is generally independent of the laser used and has been classically determined by the critical speed and accuracy of the beam positioning system. Although better ways of processing links to improve both the quality and yield are still desirable, such desirable improvements should take into consideration limitations imposed by conventional beam positioning systems.

SUMMARY OF THE INVENTION

An object of the present invention is to provide a method of and an apparatus for improving the processing quality of removal of conductive link material and overlying passivation structure material fabricated on a substrate.

Another object of the invention is to process such a link with a set of low energy laser pulses.

A further object of the invention is to employ such sets of laser pulses to process links on-the-fly.

One current trend in link manufacturing is to make relatively thick links (greater than about 1 μm thick to about 2 μm thick or thicker) from metallic materials, and such links complicate the link severing process even further. It has proven particularly difficult to completely remove such links with a single pulse of conventional laser output at sufficient throughput without causing unacceptable damage to surrounding materials. One solution would be to provide a first pass with a single laser pulse at each link to be severed with energy insufficient to cause unwanted damage, and then to provide a second pass of a similar or less powerful pulse to each link to clean out any artifacts without risking damage to the surrounding materials. Unfortunately, this practice would entail either a long dwell time over each link or separate duplicative scanning passes of repositioning and refiring at each selected link, effectively reducing the throughput by factor of about two or more.

In U.S. Pat. No. 6,574,250, Sun et al. disclose methods for coordinating laser output pulse generation and the relative movement imparted by a beam positioner to deliver a set of two or more time-displaced laser output pulses to each link structure in the same temporal window that conventional beam positioners employ to deliver a single conventional laser pulse. The delivery of pulses in the set is so fast that the spot area of each laser output pulse encompasses the link width, and the method provides high throughput, high quality link removal without risk of damage to a proximal passivation layer or substrate.

In U.S. Pat. No. 6,574,250 and in U.S. Pat. Pub. No. 2003/0151053, Sun et al. disclose novel ways to generate the sets of pulses within the beam positioning time window. One embodiment employs a continuous wave (CW) mode-locked laser at high laser pulse repetition rate, followed by optical gate and an amplifier, while another embodiment employs a Q-switched and CW mode-locked laser. Additional embodiments employ: a step-controlled acousto-optic (A-O) Q-switched laser system; a laser system having a beam splitter and an optical delay path; and two or more synchronized but temporally offset lasers that share a portion of an optical path. Each of these embodiments has its own advantages, but general disadvantages include additional cost, additional space, or additional optical or alignment components.

In U.S. Pat. Pub. No. 2002/0167581, Cordingley et al. propose a process similar to the inventions disclosed by Sun et al. but Cordingley et al. appear to focus their work on laser-work piece thermal interactions that are inherent to delivering pulses within the beam positioning time window described by Sun et al.

In U.S. Pat. No. 6,727,458, Smart proposes use of two identical closely-spaced, square-shaped or sawtooth-shaped laser pulses from a seed laser diode and optical amplifier.

General embodiments of the present invention employ a master oscillator/power amplifier (MOPA), wherein a laser output emitted from a diode laser is injected into a power amplifier. The driver of the diode laser is specially controlled to generate a temporal power profile of two or more pulses for each link structure to be processed. The power amplifier operates in an unsaturated state to provide amplified laser output that substantially replicates the temporal power profile of the injected laser output in order to deliver a set of two or more working laser pulses to each link to be processed, instead of using a single laser pulse of conventional link processing systems.

Because the whole duration of the set is shorter than about 1,000 ns, the set is considered to be a single "pulse" by a traditional link-severing laser positioning system. This practice does not, therefore, entail either a long dwell time or separate duplicative scanning passes of repositioning and refiring at each selected link 22 that would effectively reduce the throughput by factor of about two or more.

Each working laser pulse within the set has an energy or peak power per pulse that is less than the damage threshold for the (silicon) substrate 42 supporting the link structure 36. The number of working laser pulses in the set is controlled such that the last pulse cleans off the bottom of the link 22 leaving the underlying passivation layer 46 and the substrate 42 undamaged and operationally intact.

In some embodiments, the temporal power profile of at least one working laser pulse within the set is also individually tailored to provide the spike at any time during the pulse duration that is advantageous for processing the specific link structure. Other techniques of modulating the temporal power profile of each pulse can be used, such as employing multiple spike peaks or oscillating peak power amplitude, based on different link structures. In some embodiments, at least one laser pulse in the set has a temporal power profile that is different from at least one other pulse in the set. For example, a working pulse subsequent to the first working pulse in a set has a reduced amplitude and/or a reduced pulse duration.

Additional objects and advantages of this invention will be apparent from the following detailed description of preferred embodiments, which proceeds with reference to the accompanying drawings.

BRIEF DESCRIPTION OF THE DRAWINGS

FIG. 1 is a schematic diagram of a portion of a prior art DRAM showing the redundant layout of and programmable links in a spare row of generic circuit cells.

FIG. 2A is a fragmentary cross-sectional side view of a conventional, large semiconductor link structure receiving a laser pulse characterized by a prior art pulse parameters.

FIG. 2B is a fragmentary top view of the link structure and the laser pulse of FIG. 2A, together with an adjacent circuit structure.

FIG. 2C is a fragmentary cross-sectional end view of the link structure of FIG. 2B showing the width dimensions of two adjacent links and the passivation layer stack associated with them.

FIGS. $2D_1$ and $2D_2$ are fragmentary cross-sectional views of the link structure of FIG. 2B after link removal by application of a prior art laser pulse.

FIGS. 3A and 3B show, respectively conventional and substantially square-shaped laser pulse temporal power profiles.

FIG. 4 is a power versus time graph showing an exemplary typical interval between sequential laser pulses that are used to sever spaced-apart links.

FIG. 5 is a power versus time graph of useful MOPA pulses having four different pulse widths.

Figure 6A:
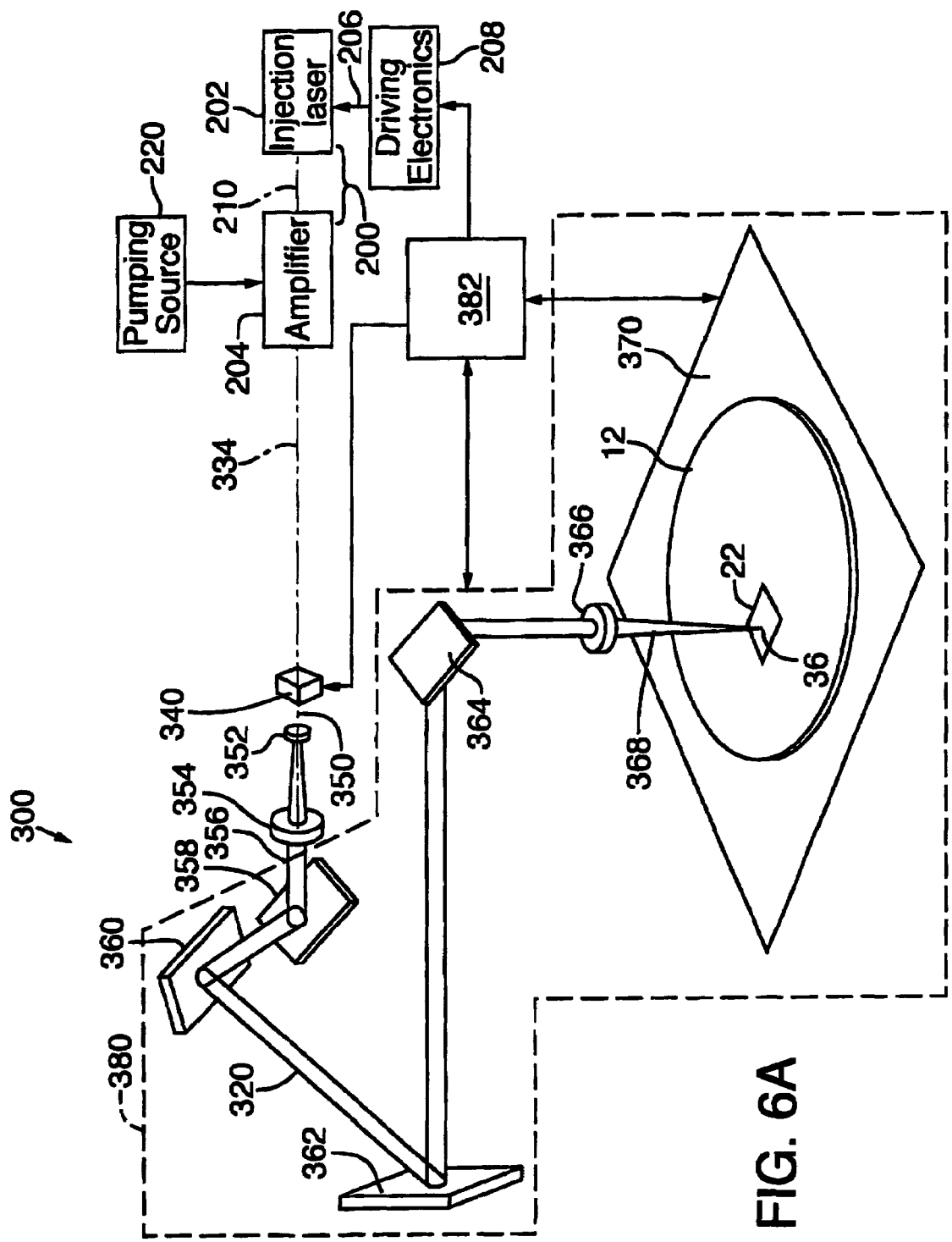

FIG. 6A is a partly schematic, simplified diagram of an embodiment of an exemplary laser system implemented with a MOPA laser and a work piece positioner that cooperate with a laser processing control system to process links.

FIG. 6B is a simplified exemplary diagram showing how an injection laser followed by an amplifier can be operated in an unsaturated state to amplify without distortion an injection laser pulse to a desired energy level.

FIGS. 7A, 7B, and 7C are power versus time graphs showing exemplary sets of laser pulses employed to sever links with a typical positioning system interval between sequential spaced-apart links.

Figure 8A:
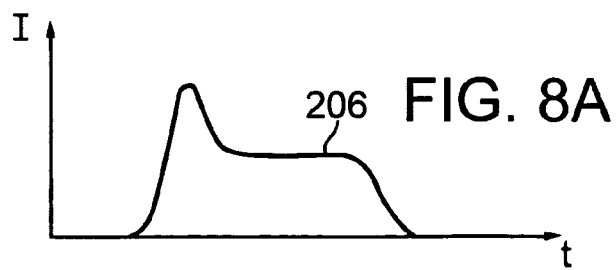
Figure 8B:
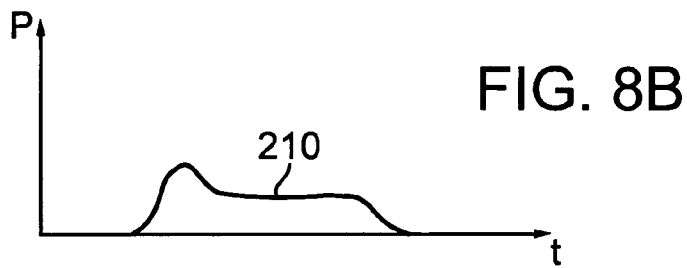
Figure 8C:
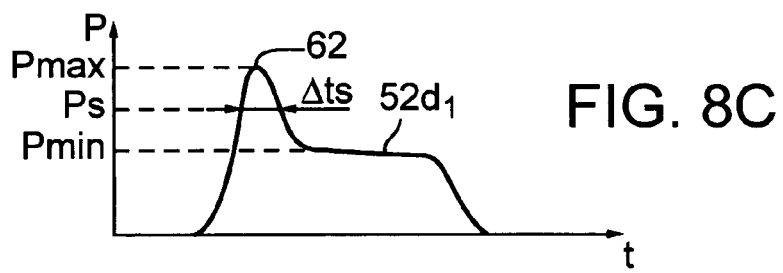

FIGS. 8A, 8B, and 8C show an exemplary specially tailored injection laser drive current profile, a resultant injection laser pulse power profile, and an amplified laser pulse power profile replicating that of the injection laser pulse.

Figure 8D:
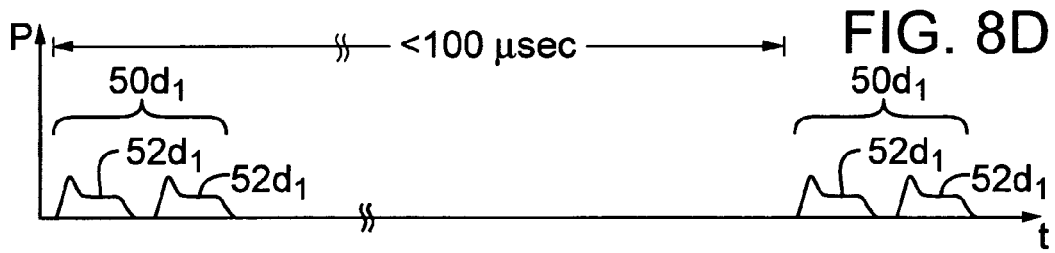
Figure 8E:
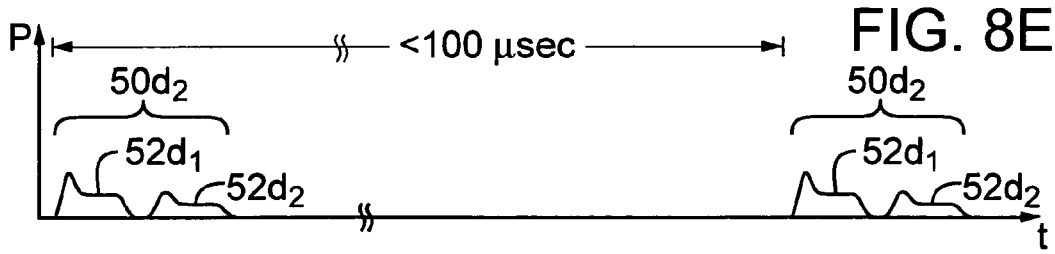
Figure 8F:
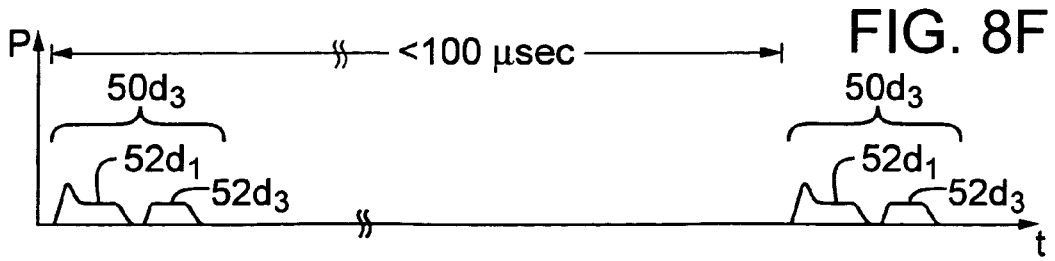

FIGS. 8D–8F show power versus time graphs of exemplary sets that include the specially tailored laser pulse of FIG. 8C for severing links within a typical positioning system interval.

Figure 9A:
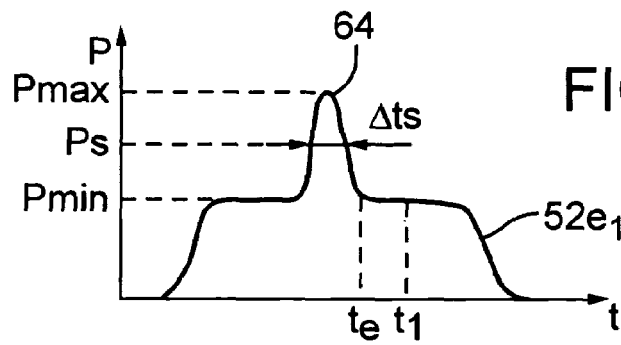

FIG. 9A shows an alternative amplified laser pulse power profile.

Figure 9B:
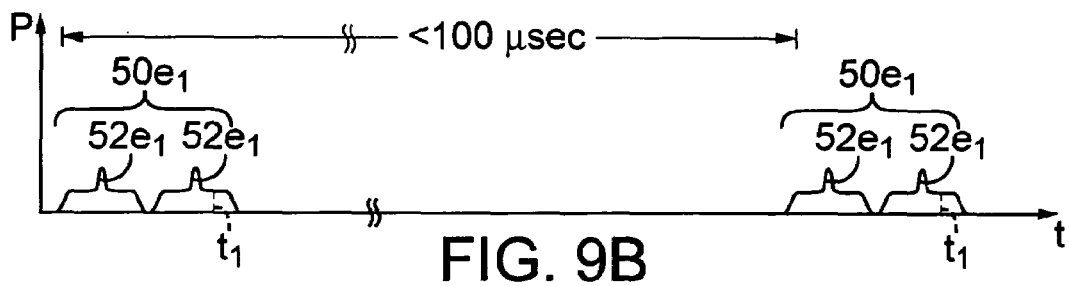
Figure 9C:
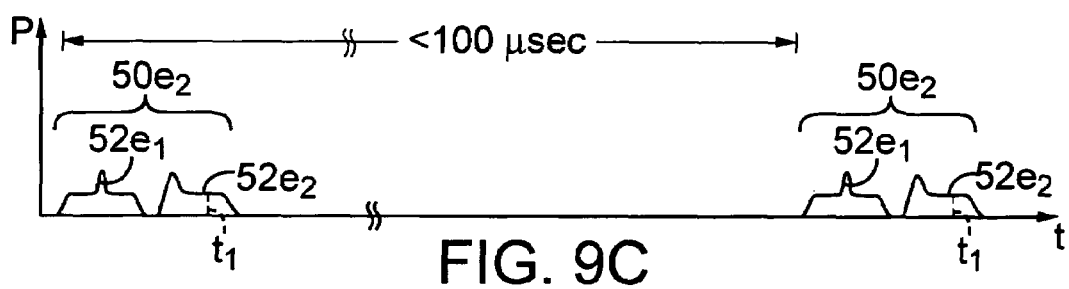
Figure 9D:
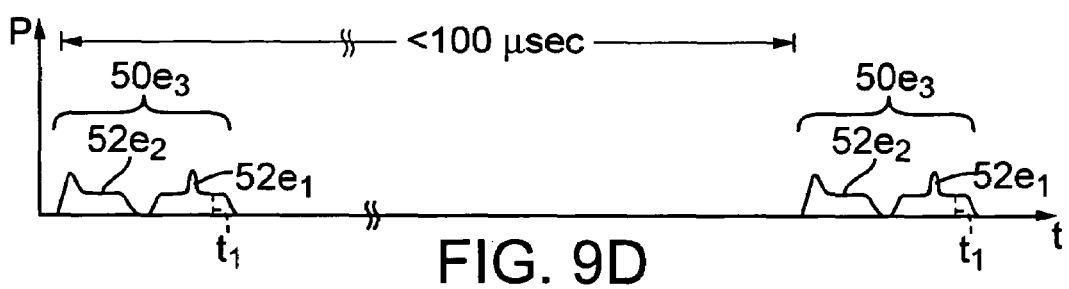

FIGS. 9B, 9C, and 9D show power versus time graphs of exemplary sets that include the specially tailored laser pulse of FIG. 9A for severing links within a typical positioning system interval.

Figure 10A:
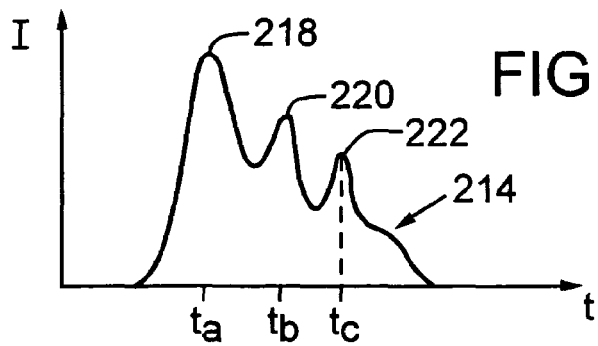
Figure 10B:
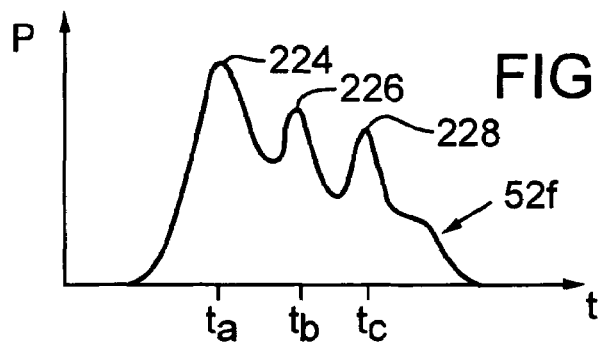

FIGS. 10A and 10B show an alternative injection laser drive current profile and amplified laser pulse power profile.

Figure 10C:
Figure 10D:
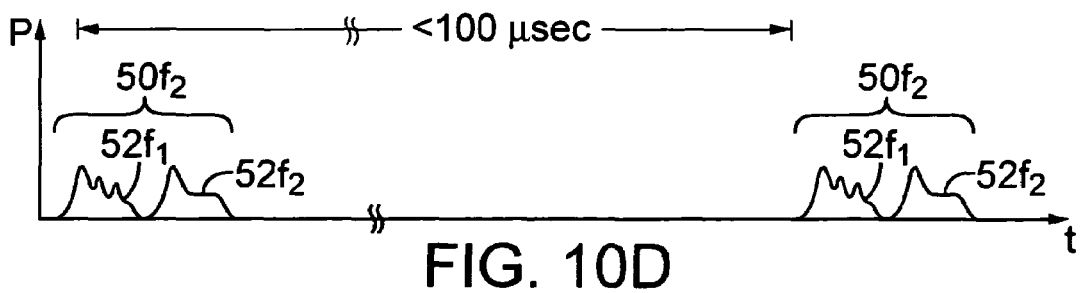

FIGS. 10C and 10D show power versus time graphs of exemplary sets that include the specially tailored laser pulse of FIG. 10B for severing links within a typical positioning system interval.

Figure 11:
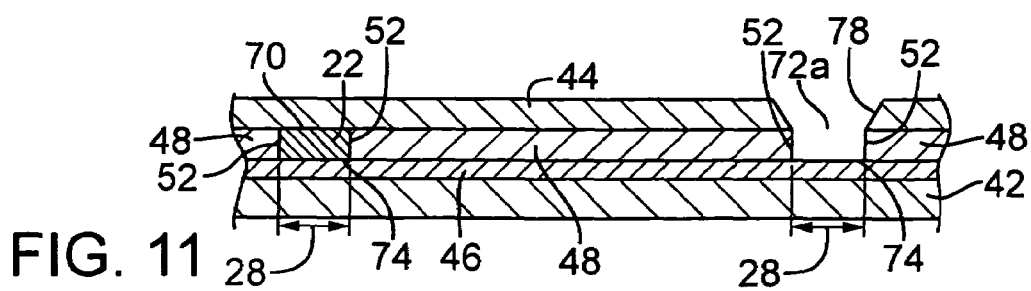

FIG. 11 is a fragmentary cross-sectional view of the link structure of FIG. 2C after link removal by application of a set of at least two laser pulses tailored to sever a link.

DETAILED DESCRIPTION OF PREFERRED EMBODIMENTS

FIG. 6A is a partly schematic, simplified diagram of an embodiment of an exemplary laser system 300 implemented with a MOPA laser 200 and a beam delivery and material positioning system 380 (positioning system 380) that cooperate with a laser processing control system to process links 22. With reference to FIG. 6A, a MOPA laser 200 includes an injection laser 202 followed by an amplifier 204. Injection laser 202 can be a diode laser having a fast response time and delivering laser output 210 at a laser wavelength that matches the gain spectrum of amplifier 204. Such a diode laser can be a single frequency laser employing integrated distributed feedback or a distributed Bragg reflector, or such diode laser can be tuned with extracavity components. Such a diode laser can also be a multimode diode laser.

Amplifier 204 is preferably a fiber amplifier comprising a conventional fiber lasant material and is preferably pumped by a conventional continuous wave (CW) pumping source 220. One preferred embodiment of amplifier 204 is a fiber laser amplifier. Ytterbium-doped fiber lasants are common and commercially available. Pumping source 220 is also preferably a diode laser and may emit at wavelength different from that of the injection laser 202.

The length of the fiber, type of lasing dopant, doping level, and pumping level can be tailored to realize the desired amplification gain. An exemplary laser 200 can be a modification of a fiber laser manufactured by IMRA, America, Inc., and IPG Photonics Corp., Oxford, Mass. Both IMRA and IPG manufacture laser devices that include a fast laser diode operating as the injection laser followed by a fiber power amplifier. The laser wavelength is tunable in the 1.06 μm to 1.1 μm range.

FIG. 5 shows useful MOPA pulses $37c_1$, $37c_2$, $37c_3$, and $37c_4$ having four different programmable pulse widths from 25 ns to 10 ns derived from an IPG MOPA laser at about a 20–30 kHz laser pulse repetition rate with laser energy of 0.1 µJ to 10 µJ. These laser pulse shapes are not substantially square and have a generally monotonically or steadily decreasing shape (within limits of noise). With the tailoring of the drive current supply to the fast diode laser, the laser pulse power profile can be tailored as described herein. Another exemplary fiber laser manufactured by INO, Quebec, Canada implements a special technique to get the injection laser pulse from the fiber itself and then use the fiber to amplify the injection pulse. Its currently available version works at a laser wavelength of 1.57 µm. According to INO, it is not difficult for them to make a similar laser working at wavelength of 1.06 µm to 1.1 µm.

The preferred laser wavelengths are in the spectral range from about 150 nm to about 2000 nm, and include, but are not limited to, 1.54, 1.3, 1.1–1.06, 1.05, 1.047, 1.03–0.75 µm to the extent that amplifiers 204 are or become available at these wavelengths, or their second, third, fourth, or fifth harmonics. Exemplary harmonic wavelengths include, but are not limited to, about 0.75, 0.65, 0.532, 0.5, 0.43, 0.355, and 0.266 µm. Skilled persons will appreciate that any of these harmonics having sufficient power can be employed to process certain types of links 22 and/or passivation layers 44 using appropriate well-known harmonic conversion techniques. Harmonic conversion processes are described in V. G. Dmitriev, et. al., *Handbook of Nonlinear Optical Crystals*, 138–141, Springer-Verlag, N.Y., 1991 ISBN 3□540-53547-0.

FIGS. $6B_1$ and $6B_2$ (generically FIG. 6B) show how a set 50 of two or more laser pulses $52_1$ and $52_2$ can be generated from a MOPA laser 200 to process a link 22 without saturating the amplifier 204 to permit the laser pulse power profile to correspond to the profile of the drive current delivered to the injection laser 202. With reference to FIG. $6B_1$, an exemplary injection laser output pulse profile $210_a$, such as a maximum "flat top" profile, can be injected into the laser power amplifier 204 to produce an amplified laser output pulse 212 that corresponds to the injection profile $210_a$ without distortion of the profile caused by saturation.

With reference to FIG. $6B_2$, two or more injection pulses $210_1$ and $210_2$ can be injected into laser power amplifier 204 within the interval that positioning system 380 can address a link 22 while the positioning system 380 is continuously moving on-the-fly. Injection pulses $210_a$ and $210_2$ preferably fit within the envelope of the profile of injection pulse $210_a$ so that the corresponding laser output pulses $52_1$ and $52_2$ will fit within the profile of laser output pulse 212 and correspond to the shape of the pulses $210_1$ and $210_2$ without distortion caused by saturation, faithfully reproducing the profile of the drive current 206 that produced them.

FIGS. 7A, 7B, and 7C (generically FIG. 7) show power versus time graphs of exemplary sets 50a, 50b, and 50c (generically sets 50) of laser pulses $52a_1$ and $52a_2$, $52b_1$ and $52b_2$, and $52c_1$ and $52c_2$ (generically laser pulses 52) employed to sever links 22 in accordance with the present invention. Preferably, each set 50 severs a single link 22. Preferred sets 50 include 2 to 50 pulses 52. The duration of each set 50 is preferably shorter than about 1000 ns, more preferably shorter than 500 ns, and most preferably in the range of about 5 ns to 300 ns. Sets 50 are time-displaced by a programmable interval that is typically shorter than 0.5 millisecond, often shorter than 0.1 millisecond, and usually in the range of 25–50 microseconds, and may be a function of the speed of the positioning system 380 and the distance between the links 22 to be processed. Because the whole duration of the set is shorter than 1,000 ns, the set is considered to be a single "pulse" by a traditional link-severing positioning system 380.

The pulse width of each laser pulse 52 within set 50 is in the range of about 30 ns to about 100 fs or shorter. In some embodiments, each set 50 preferably includes 2 to 10 pulses 52, which are preferably in the range of about 0.1 ps to about 30 ns and more preferably from about 25 ps to 30 ns or ranges in between such as from about 100 ps to 10 ns or from 5 ns to 20 ns. In some preferred embodiments, the time interval between the falling edge of the first pulse and the leading edge of the second pulse can be from about zero to about 500 ns. The time interval between the pulses can be adjusted to optimize pulse and target interactions or minimize interactions with plumes or debris. Skilled persons will appreciate that the intervals between pulses 52, the interval between sets 50, and the pulse widths of pulses 52 are not drawn to the same scale in the figures.

The focused laser spot diameter is within the range of between about 0.5 µm and about 3 µm and preferably 40% to 100% larger than the width of the link 22, depending on the link width 28, link pitch size 32, link material and other link structure and process considerations. The laser spot of each of the working pulses in the set encompasses the link width 28, and the displacement between the laser spots 38 of each working pulse is less than the positioning accuracy of a typical positioning system 380, which is typically +−0.05 to 0.2 µm. Thus, the laser system can still process links 22 on-the-fly, i.e. the positioning system 380 does not have to stop moving when the laser system fires a set of working laser pulses at each selected link 22.

During a set 50 of laser pulses 52, each laser pulse 52 has insufficient heat, energy, or peak power to fully sever a link 22 or damage the underlying substrate 42 and removes only a part of link 22 and/or any overlying passivation layer 44, even if the laser wavelength used is shorter than 1.3 µm, in the visible range, or in the UV range. At a preferred wavelength from about 150 nm to about 2000 nm, preferred ablation parameters of focused spot size 40 of laser pulses 52 include laser energies of each laser pulse between about 0.005 µJ to about 10 µJ (and intermediate energy ranges between 0.01 µJ to about 0.1 µJ) and laser energies of each set between 0.01 µJ to about 10 µJ at greater than about 1 Hz and preferably 10 kHz to 50 kHz or higher.

The energy density or power profile of each set 50 of laser pulses 52 can be controlled better than the energy density profile of a conventional single multiple nanosecond laser pulse and can have almost any predetermined shape. Depending on the wavelength of laser output and the characteristics of the link material, the severing depth of pulses 52 applied to link 22 can be accurately controlled by choosing the energy of each pulse 52 and the number of laser pulses 52 in each set 50 to clean off the bottom of any given link 22, leaving the underlying passivation layer 46 relatively intact or operationally undamaged and the substrate 42 relatively untouched or undamaged. Hence, the risk of operational damage to silicon substrate 42 is substantially eliminated, even if a laser wavelength in the UV range is used.

With reference to FIG. 7A, the power profile of pulses $52a_1$ and $52a_2$ (generically 52a) in each set 50a are substantially identical and sets 50a are substantially identical. Optional subsequent pulses 52a (not shown) in each set 50a can also have substantially identical power profiles or different power profiles.

With reference to FIG. 7B, the power profile of pulses $52b_2$ have shorter amplitudes than those of respective pulses $52b_1$ in each set 50b. Optional subsequent pulses 52b (not shown) in each set 50b preferably have shorter amplitudes than those of respective pulses $52b_2$. Such an energy density profile for a set 50b would be useful to clean out the bottom of the link without risk of damage to a particularly sensitive work piece.

With reference to FIG. 7C, the power profile of pulses $52c_2$ have substantially similar amplitudes but shorter pulse widths than those of respective pulses $52c_1$ in each set 50c. Optional subsequent pulses 52c (not shown) in each set 50c preferably have shorter pulse widths than those of respective pulses $52c_2$. Skilled persons will appreciate, however, that pulses $52c_2$ and subsequent pulses 52c may have both shorter amplitudes and shorter pulse widths than the immediately prior respective pulses. Skilled persons will also appreciate that even though each pulse 52 shown in FIG. 7 has gradually decreasing amplitude, other power profiles can be employed such as a "flat-top" or "bell-shape" power profile.

FIGS. 8A–8F (generically FIG. 8) demonstrate formation of specially tailored working laser pulses 52 that may be implemented as one or more of the laser pulses $52d_1$ in one or more sets $50d_1$–$50d_3$ (generically sets 50d). With reference to FIGS. 6 and 8, FIG. 8A shows a specially tailored drive current pulse 206 delivered from drive electronics 208, and FIG. 8B shows that an injection laser output pulse 210 propagating from injection laser 202 replicates the profile of drive current pulse 206 as a result of the fast response capability of injection laser 202. Injection laser output pulse 210 is delivered to laser power amplifier 204, which is operating in an unsaturated state to amplify injection laser output pulse 210 and deliver a working laser pulse $52d_1$ without introducing significant distortion of the tailored laser pulse power profile, as shown in FIG. 8C. Working laser pulse $52d_1$ is relatively flat after the occurrence of the power spike and before the falling edge of the laser pulse temporal power profile. Persons skilled in the art will appreciate that the profile of drive current pulse 206 can be readily programmed to any preferred profile. Persons skilled in the art will also appreciate that the gain requirement of amplifier 204 depends on the laser pulse power available from injection laser 202 and the power of the working laser pulse $52d_1$.

With reference again to FIG. 8C, the specially tailored laser pulse power profile of laser pulse $52d_1$ provides for a significant spike 62 appearing at the beginning of the laser pulse. The peak power of the spike is Pmax, and the average power of the laser pulse is Pmin. The amplitude of the spike is defined as Pmax-Pmin. The width of the spike, )ts, is defined as the full duration time at the middle power point, Ps, between Pmax and Pmin. The peak power of the spike, Pmax, is preferably about 10% to about 50% over the average power of the laser pulse, Pmin. The width of the spike, )ts, is preferably 10% to 50% of the duration of the laser pulse. The rise time of the spike is typically shorter than about 5 ns, and preferably shorter than about 2 ns. Preferred timing of the power spike is within an interval measured from the rising edge of the laser pulse power profile to 70% of the duration of the laser pulse power profile. For purposes of convenience, the term "spike" is used throughout the remainder of the application to indicate a significant, transient increase in laser power, irrespective of when it occurs during the laser pulse. One, some, or all pulses 52 in a set 50d may have a specially tailored laser pulse profile.

FIGS. 8D–8F show power versus time graphs of exemplary sets 50d having at least one laser pulse $52d_1$ with the specially tailored laser pulse power profile shown in FIG. 8C for severing a link 22 within a typical positioning system interval. In particular, FIG. 8D depicts exemplary substantially identical sets $50d_1$ that each employ two of more substantially identical specially tailored pulses $52d_1$ to sever a link 22 within the time interval that the positioning system 380 is in range of the link 22 during on-the-fly processing.

FIG. 8E depicts alternative exemplary substantially identical sets $50d_2$ that each employ two of more specially tailored pulses $52d_1$ and $52d_2$ to sever a link 22 within the time interval that the positioning system 380 is in range of the link 22 during on-the-fly processing. Specially tailored pulses $52d_2$ have a laser pulse power profile that corresponds to that of $52d_1$ but has a proportionally smaller intensity through most of the profile.

FIG. 8F depicts alternative exemplary substantially identical sets $50d_3$ that each employ two of more specially tailored pulses $52d_1$ and $52d_3$ to sever a link 22 within the time interval that the positioning system 380 is in range of the link 22 during on-the-fly processing. Specially tailored pulses $52d_1$ are followed by one or more pulses $52d_3$ that have a laser pulse power profile with substantially no spike. With respect to FIGS. 8C–8F, skilled persons will appreciate that sets $50d_1$–$50d_3$ need not be identical, need not have the respective same number of pulses, and need not have pulses with the same respective power profiles.

FIG. 9A shows another embodiment that employs a power profile with a spike 64 appearing not at the beginning of, but during the middle of, laser pulse $52e_1$. The spike ends at time, $t_e$, which is before the time, $t_1$, when the laser energy of the final pulse in a pulse set 50e totally removes the link material from a link 22 of average characteristics.

With reference to FIG. 9A, the power level is relatively flat before and after pulse spike 64; however, the laser pulse power profile can have a changing power level before and after pulse spike 64. Tailoring the laser pulse power profile in this manner provides a mid-pulse spike with sufficient laser peak power and energy to facilitate the satisfactory removal of the link material and, upon total removal of the link material, much lower laser pulse power to ensure no risk of damage to the silicon substrate and the structure neighboring the link. As a result, such special tailoring of the laser power profile delivers much better processing results and a wider process window and reduces risk of damage to the silicon substrate and to the structure neighboring the link. One, some, or all pulses 52 in a set 50 may have such a specially tailored laser pulse profile.

FIGS. 9B–9C show power versus time graphs of exemplary sets $50e_1$ and $50e_2$ (generically sets 50e) that include at least one laser pulse $52e_1$ with the specially tailored laser pulse profile shown in FIG. 9A for severing a link 22 within a typical positioning system interval.

In particular, FIG. 9B depicts exemplary substantially identical sets $50e_1$ that each employ two of more substantially identical specially tailored pulses $52e_1$ to sever a link 22 within the time interval that the positioning system 380 is in range of the link 22 during on-the-fly processing.

FIG. 9C depicts alternative exemplary substantially identical sets $50e_2$ that each employ two of more specially tailored pulses $52e_1$ and $52e_2$ to sever a link 22 within the time interval that the positioning system 380 is in range of the link 22 during on-the-fly processing. Specially tailored pulses $52e_2$ have a laser pulse power profile that corresponds to that of $52d_1$. FIG. 9D depicts alternative exemplary substantially identical sets $50e_3$ that each employ two of more specially tailored pulses $52e_1$ and $52e_2$ in the reverse order of that depicted in FIG. 9C.

FIGS. 10A and 10B show, respectively, a drive current profile 214 and its replicated laser pulse power profile of laser pulse 52f produced in accordance with a different implementation of another embodiment. Drive current profile 214 is composed of a pulse with three time-displaced current spikes 218, 220, and 222 of decreasing values over time at $t_a$, $t_b$, $t_c$, respectively. Current spikes 218, 220, and 222 produce for laser pulse power profile 216 corresponding power spikes 224, 226, and 228. Power spike 224 occurs at the rising edge of laser pulse power profile 216, and subsequent power spikes 226 and 228 occur during the laser pulse 52f but before the target link material is completely removed by the final pulse 52f in a set 50f. Power spikes 224, 226, and 228 together form a composite power spike in the form of an oscillating wave with a power variation of over about 10% of the average power of the laser output pulse. The drive current may for example comprise an oscillating wave to facilitate propagation of some or all of such spikes. For example, from about one-half cycle to three cycles of duration may be passed to the injection laser within the duration of the laser pulse power profile. The period of the oscillation cycle is preferably between about 5 ns and about 1 ns or shorter. One, some, or all pulses 52f in a set 50f may have such a specially tailored laser pulse profile.

FIGS. 10C–10D show power versus time graphs of exemplary sets 50f that include laser pulses 52f having the specially tailored laser pulse power profile shown in FIG. 10B for severing links within a typical positioning system interval. In particular, FIG. 10C depicts exemplary substantially identical sets $50f_1$ that each employ two of more substantially identical specially tailored pulses $52f_1$ to sever a link 22 within the time interval that the positioning system 380 is in range of the link 22 during on-the-fly processing.

FIG. 10D depicts alternative exemplary substantially identical sets $50f_2$ that each employ two of more specially tailored pulses $52f_1$ and $52f_2$ to sever a link 22 within the time interval that the positioning system 380 is in range of the link 22 during on-the-fly processing. Specially tailored pulses $52f_2$ have a laser pulse power profile that corresponds to that of $52d_1$. The pulse sets 50 demonstrated in FIGS. 9D and 10C may be particularly useful for processing thicker links 22 and/or composite links 22 such as link stacks having a titanium nitride antireflective surface layer, an aluminum body, and titanium nitride and titanium shunting layers. The delayed spikes would be useful for processing the higher melting point link components surrounding the aluminum. The particular shape of the pulses 52, and particularly the amplitude and delay with respect to the spike, can be adjusted to accommodate the particular materials and their thickness in any given link 22.

Skilled persons will appreciate that with respect to all the exemplary embodiments disclosed herein that sequential sets 50 may have different peak power and energy density profiles, particularly if links 22 and/or passivation layers 44 with different characteristics (different materials and/or different dimensions) are being processed. Skilled persons will also appreciate that sequential sets 50 may be generated at different intervals from each other.

With reference again to FIG. 6, laser 200 of laser system 300 propagates a laser output 334 of sets 50 of laser pulses 52 along a beam path 320 connected by a variety of optional conventional optical components 352 and 354. Components 352 and 354 may include, for example, a beam expander or other laser optical components to collimate laser output 350 to produce a beam with useful propagation characteristics. One or more beam reflecting mirrors 358, 360, 362, and 364 that are highly reflective at the laser wavelength desired, but highly transmissive at the unused wavelengths, are optionally employed so that only the desired laser wavelength will reach link structure 36. A focusing lens 366 preferably employs a single component or multicomponent lens system that focuses a collimated pulsed laser system output 368 to produce a focused spot size 40 (FIG. 2B) that is greater than and thereby encompasses the link width 28 and is preferably less than 2 µm in diameter or smaller, depending on the link width 28 and the laser wavelength.

A preferred positioning system 380 is described in detail in U.S. Pat. No. 4,532,402 of Overbeck for Method and Apparatus for Positioning a Focused Beam on an Integrated Circuit. Positioning system 380 may alternatively or additionally employ the improvements or beam positioners described in U.S. Pat. No. 5,751,585 of Cutler et al., U.S. Pat. No. 6,430,465 B2 of Cutler, and/or U.S. Pat. Pub No. 2002-0117481 A1, which are assigned to the assignee of this application. Other fixed-head systems, fast positioner-head systems such as galvanometer-, piezoelectrically-, or voice coil-controlled mirrors, or linear motor-driven conventional positioning systems or those employed in the 5300, 9300, or 9000 model series manufactured by Electro Scientific Industries, Inc. (ESI) of Portland, Oregon could also be employed.

Positioning system 380 preferably employs a laser controller 382 that controls at least two platforms or stages (stacked or split-axis) 370 and coordinates with beam reflecting mirrors 358, 360, 362, and 364 and other optical components to target and focus laser system output 368 to a selected conductive link 22 on IC device or work piece 12. Positioning system 380 permits quick movement between links 22 on work piece 12 to effect unique link-severing operations on-the-fly, based on provided test or design data.

The position data preferably direct the focused laser spot 38 (FIG. 2B) over work piece 12 to target link structure 36 with one set 50 of laser pulses 52 of laser system output 368 to remove link 22. The laser system 300 preferably severs each link 22 on-the-fly with a single set 50 of laser pulses 52 without stopping the positioning system 380 over any link 22, so high throughput is maintained. Because the sets 50 are less than about 1,000 ns, each set 50 is treated like a single pulse by the positioning system 380, depending on the scanning speed of the positioning system 380. For example, if a positioning system 380 has a high speed of about 200 mm per second, then a typical displacement between two consecutive laser spots 38 with an interval time of 1,000 ns between them would be typically less than 0.2 µm, and preferably less then 0.06 µm during a preferred time interval of 300 ns of set 50, so two or more consecutive spots 38 would substantially overlap, and each of the spots 38 would completely cover the link width 28. In addition to control of the repetition rate, the time offset between the initiation of pulses 52 within a set 50 is typically less than 1,000 ns and preferably between about 5 ns and 500 ns.

Laser controller 382 is provided with instructions concerning the proper processing of the selected links. Laser controller 382 may be influenced by timing data that synchronizes the firing of laser system 300 to the motion of the platforms such as described in U.S. Pat. No. 5,453,594 of Konecny for Radiation Beam Position and Emission Coordination System.

Although the sets 50 may be generated at different intervals from each other, skilled persons will appreciate that for stability and other laser considerations that it is preferred to generate the sets 50 at a substantially constant repetition rate regardless of whether the pulses 52 are employed as working pulses to impinge a target link 22. In such embodiments, the system controller 382 commands the positioning system 380 to move and direct its aim at target location before the system controller 382 sends a "gating ON" gating signal to an optional laser pulse gating device 340. When processing the link 22 at the target location is completed, the scan head continues to move to the next target location while the system controller 382 sends a "gating OFF" gating signal to the laser pulse gating device 340. The laser 200 remains running at a desired repetition rate, so there is no thermal loading variation on any the wavelength converter(s), and thermally induced harmonic pulse energy drifting is thus eliminated. Exemplary laser pulse gating devices include high speed electro-optic (E-O) devices or acousto-optic (A-O) devices, such as Model N30085-05 made by NEOS Technologies, Melbourne, Fla. or modified versions of it. Further details concerning on-demand triggering of a laser pulse gating device 340 can be found in U.S. Pat. No. 6,172,325 of Baird et al. and U.S. patent application Ser. No. 10/611,798 of Sun et al., which are herein incorporated by reference.

Radio-frequency (RF) loading control techniques described in U.S. patent application Ser. No. 10/611,798 of Sun et al. can additionally be employed to provide nearly constant thermal loading on an A-O laser pulse gating device 340 by applying an RF pulse to the A-O gating device 340 in coincidence with pulses 52 of sets 50 when the positioning system 380 is directed at a target location (in other words, when a working laser machining output is demanded) and by applying an RF pulse with the same RF energy to the A-O gating device 340 but in noncoincidence with the pulses 52 of sets 50 when the positioning system 380 is directed at an intermediate location (in other words, when a working laser machining output is not demanded). Skilled persons will appreciate that with such substantially constant thermal loading on an A-O gating device 340, there are minimal adverse effects by an A-O gating device 340 on the quality and positioning accuracy of the working laser machining output.

In view of the foregoing, link processing with sets 50 of laser pulses 52 offers a wider processing window and a superior quality of severed links than does conventional link processing without sacrificing throughput. The versatility of pulses 52 in sets 50 permits better tailoring to particular link characteristics. Because each laser pulse 52 in the laser pulse set 50 has less laser energy, there is less risk of damaging the neighboring passivation and the silicon substrate 42. In addition to conventional link blowing IR laser wavelengths, laser wavelengths shorter than the IR can also be used for the process with the added advantage of smaller laser beam spot size, even though the silicon wafer's absorption at the shorter laser wavelengths is higher than at the conventional IR wavelengths. Thus, the processing of narrower and denser links is facilitated. This better link removal resolution permits links 22 to be positioned closer together, increasing circuit density. Although link structures 36 can have conventional sizes, the link width 28 can, for example, be less than or equal to about 0.5 μm.

Similarly, the versatility of better tailoring the laser pulse power profile offers better flexibility in accommodating different passivation characteristics. With reference to FIGS. 2A–2C, passivation layers 44 above or passivation layers 46 below links 22 can be made with material other than the traditional materials or can be modified, if desired to be other than a typical height. New material or dimensions can be employed because the sets 50 and the laser pulses 52 within them can be tailored and thereby reduces the risk of damage to the underlying or neighboring passivation structure. In addition, because wavelengths much shorter than about 1.06 μm can be employed to produce critical spot size diameters 40 of less than about 2 μm, the center-to-center pitch 32 between links 22 processed with sets 50 of laser pulses 52 can be substantially smaller than the pitch 32 between links 22 blown by a conventional single IR laser beam-severing pulse. Link 22 can, for example, be within a distance of 2.0 μm or less from other links 22 or adjacent circuit structures 34.

Overlying passivation layer 44 may include any conventional passivation materials such as silicon dioxide ($SiO_2$), silicon oxynitride (SiON), and silicon nitride ($Si_3N_4$). Underlying passivation layer 46 may include the same passivation material as or different passivation material(s) from overlying passivation layer 44. In particular, underlying passivation layer 46 in target structures 36 may be formed from fragile materials, including but not limited to, materials formed from low K materials, low K dielectric materials, low K oxide-based dielectric materials, orthosilicate glasses (OSGs), fluorosilicate glasses, organosilicate glasses, a tetraethylorthosilicate-based oxide (TEOS-based oxide), methyltriethoxyorthosilicate (MTEOS), propylene glycol monomethyl ether acetate (PGMEA), silicate esters, hydrogen silsesquioxane (HSQ), methyl silsesquioxane (MSQ), polyarylene ethers, benzocyclobutene (BCB), SiCOH or SiCOH-derived film (such as "Black Diamond" sold by Applied Materials, Inc.), or spin on-based low K dielectric polymer (such as "SiLK" sold by Dow Chemical Company). Underlying passivation layers 46 made from some of these materials are more prone to crack when their targeted links 22 are blown or ablated by conventional single laser-pulse link-removal operations. Skilled persons will appreciate that $SiO_2$, SiON, $Si_3N_4$, low K materials, low K dielectric materials, low K oxide-based dielectric materials, OSGs, fluorosilicate glasses, organosilicate glasses, HSQ, MSQ, BCB, SiLK™, and Black Diamond™ are actual layer materials, and TEOS, MTEOS, and polyarylene ethers are semiconductor condensate precursor materials.

FIG. 11 shows the conditions of the passivation layers after link 22 has been removed by a set 50 of laser pulses 52. Passivation layer 44 overlaying a top surface 70 of link 22 has an opening 72a that extends beyond width 28 of link 22 by a relatively small amount, e.g., about the thickness of overlying passivation layer 44. Intermediate passivation layer 48 material positioned adjacent side surfaces 52 of link 22, passivation layer 46 underlying a bottom surface 74 of link 22, and substrate 42 are negligibly impacted as demonstrated by a closer and more uniform crater wall 78, and operational damage is never risked. Thus, there is far less than the typical damage that extends into the passivation structure and typical cracking in the passivation structure is diminished if not entirely eliminated. This substantially riskless link processing approach is particularly useful for processing links 22, especially thick or composite links 22, over delicate low K or other materials at UV wavelengths, for example.

It will be obvious to those having skill in the art that many changes may be made to the details of the above-described embodiments without departing from the underlying principles of this invention. The scope of the present invention should, therefore, be determined only by the following claims.

The invention claimed is:

1. A method of controlling amplifier output of a laser fiber amplifier having saturation power characteristics at a predetermined pumping level, the saturation power characteristics limiting an amount of injection laser output that can be coupled into the laser fiber amplifier without distorting profile correlations between the injection laser output and the amplifier output, comprising:

providing, to a beam positioner, beam positioning data representing one or more locations of selected electrically conductive redundant memory or integrated circuit links having associated link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer as associated with the link structures being characterized by respective laser damage thresholds, and the beam positioner in response to the beam positioning data imparting relative movement of a laser spot position to the substrate;

optically pumping the fiber laser amplifier at the predetermined pumping level to control gain imparted to the injection laser output injected into the laser fiber amplifier;

providing a set of at least first and second drive current pulses having respective first and second drive current profiles to an injection laser to generate an injection laser set of at least respective first and second injection laser pulses having respective first and second injection laser output profiles that correlate to the respective drive current profiles, the second drive current profile having a characteristic that is different from a respective characteristic of the first drive current profile;

coupling the first injection laser pulse into the laser fiber amplifier to provide a first amplifier output pulse having a first amplifier output profile that correlates to the first drive current profile, wherein the first drive current profile results in generation of the first injection laser pulse having power characteristics less than the saturation power characteristics of the laser fiber amplifier such that the laser fiber amplifier provides, in response to coupling the second injection laser pulse into the laser fiber amplifier, at least a second amplifier output pulse having a second amplifier output profile that correlates to the second drive current profile of the second drive current pulse;

optically converting each of the laser amplifier output pulses into a laser system output set of laser system output pulses characterized by respective laser spots having spot sizes and energy characteristics at the laser spot position, the spot sizes being larger than the link width and the energy characteristics being less than the respective laser damage thresholds of any underlying passivation layer and the substrate; and coordinating laser system output pulse generation and the relative movement imparted by the beam positioner such that the relative movement is substantially continuous while the laser system output pulses in the laser system output set sequentially strike the selected link structure so that the spot of each laser output pulse in the laser system output set encompasses the link width and the laser system output set severs the electrically conductive link between its associated pair of electrically conductive contacts with reduced risk of causing operational damage to any underlying passivation layer and the substrate.

2. The method of claim 1 in which at least one of the laser output pulses is characterized by a laser pulse temporal power profile having rising and falling edges, an average power, and a pulse duration and characterized by a power spike, the power spike having a spike duration that is substantially shorter than the pulse duration, a maximum power that is greater than an average power of the laser output pulse, and a time of occurrence between the rising and falling edges, and the maximum power, spike duration, and time of occurrence of the power spike cooperating to establish for the laser output pulse a specially tailored laser pulse power profile that contributes to severing of the selected link structure in the absence of operational damage to the substrate or adjacent passivation structure material.

3. The method of claim 2, in which the power spike is coincident with the rising edge of the laser pulse temporal power profile and has a peak power value that is more than about 10% over the average power of the laser output pulse.

4. The method of claim 3, in which the power spike has a rise time and in which the rise time is shorter than about 5 ns.

5. The method of claim 4, in which the rise time is shorter than about 2 ns.

6. The method of claim 3, in which the spike duration is between about 1 ns and about 50% of the pulse duration of the laser pulse temporal power profile.

7. The method of claim 3, in which the laser pulse temporal power profile after the occurrence of the power spike is tailored to decline substantially linearly with time before the falling edge.

8. The method of claim 7, in which the total power decline after the occurrence of the power spike is more than about 10% of the average power of the laser output pulse.

9. The method of claim 3, in which the laser pulse temporal power profile after the occurrence of the power spike is relatively flat before the falling edge of the laser pulse temporal power profile.

10. The method of claim 3, in which the laser pulse temporal power profile includes a first power spike coincident with the leading edge an additional power spike occurring after the first power spike.

11. The method of claim 10, in which the additional power spike has a power value that is more than 5% of the average power and a spike duration of between about 1 ns and about 30% of the pulse duration of the laser pulse temporal power profile.

12. The method of claim 1, in which the power spike is in a form of an oscillating wave with a power variation of over about 10% of the average power of the laser output pulse.

13. The method of claim 12, in which the oscillating wave lasts from one-half cycle to three cycles of oscillation within the pulse duration of the laser pulse temporal power profile, and the period of the oscillation cycle is between about 1 ns and about 15 ns.

14. The method of claim 1, in which the power spike occurs at a time within an interval measured from the rising edge to 70% of the pulse duration of the laser pulse temporal power profile.

15. The method of claim 14, in which the laser pulse temporal power profile before and after the power spike is relatively flat.

16. The method of claim 14, in which the laser pulse temporal power profile before and after the power spike is not flat.

17. The method of claim 14, in which the power spike has a peak power value that is over 10% of the average power of the laser output pulse and has a spike duration that is between 1 ns and 50% of the laser pulse temporal power profile.

18. The method of claim 2, in which the adjacent passivation structure material and/or underlying passivation layer is formed from one or more of the following materials: SiO$_2$, Si$_3$N$_4$, SiON, a low K material, a low K dielectric material, a low K oxide-based dielectric material, an orthosilicate glass, a fluorosilicate glass, an organosilicate glass, a tetra-ethylorthosilicate-based oxide, methyltriethoxyorthosilicate, propylene glycol monomethyl ether acetate, a silicate ester, hydrogen silsesquioxane, methyl silsesquioxane, a polyarylene ether, benzocyclobutene, SiCOH or SiCOH-derived film, or spin on-based low K dielectric polymer.

19. The method of claim 1, in which the selected electrically conductive link structure comprises aluminum, chromide, copper, polysilicon, disilicide, gold, nickel, nickel chromide, platinum, polycide, tantalum nitride, titanium, titanium nitride, tungsten, or tungsten silicide.

20. The method of claim 1, in which each laser output pulse has laser energy of between about 0.001 microjoule and about 10 microjoules.

21. The method of claim 1, in which the adjacent passivation structure material and/or underlying passivation layer is formed from one or more of the following materials: SiO$_2$, Si$_3$N$_4$, SiON, a low K material, a low K dielectric material, a low K oxide-based dielectric material, an orthosilicate glass, a fluorosilicate glass, an organosilicate glass, a tetra-ethylorthosilicate-based oxide, methyltriethoxyorthosilicate, propylene glycol monomethyl ether acetate, a silicate ester, hydrogen silsesquioxane, methyl silsesquioxane, a polyarylene ether, benzocyclobutene, SiCOH or SiCOH-derived film, or spin on-based low K dielectric polymer.

22. The method of claim 1, in which at least two laser output pulses are generated for removing target material aligned with locations of respective selected electrically conductive link structures at a repetition rate of greater than about 10 kHz.

23. The method of claim 1 in which a laser pulse gating device is positioned along a beam path from the fiber laser amplifier to the laser spot position on the substrate, the laser pulse gating device providing in response to control commands an output transmitting state that permits output sets of laser output pulses to propagate toward the laser spot position and an output blocking state that predominantly prevents output sets of laser output pulses from propagating toward the laser spot position, further comprising:

generating the driving sets of driving pulses at a substantially constant repetition rate in which mutually adjacent ones of the driving sets are separated from each other by generally uniform driving intervals such that amplifier sets of laser amplifier output pulses are generated at a substantially constant amplifier output repetition rate in which mutually adjacent ones of the amplifier sets are separated from each other by generally uniform amplifier output intervals; and selectively gating the amplifier sets to provide an output transmitting state to permit transmission of an output set to the laser spot position whenever it addresses a selected link structure, the laser pulse gating device providing a relatively nontransmitting state that inhibits the output set from propagating along the beam path whenever the laser spot position does not address a selected link structure.

24. The method of claim 1 in which the laser system output pulses have a wavelength about or within one of the following wavelengths or wavelength ranges: 1.54 μm, 1.3 μm, 1.1–1.06 μm, 1.05 μm, 1.047 μm, 1.03–0.75 μm, 0.65 μm, 0.53 μm, 0.5 μm, 0.43 μm, 0.35 μm, or 0.27 μm.

25. The method of claim 24 in which the link has a thickness of greater than 1 μm.

26. The method of claim 1 in which the link has a thickness of greater than 1 μm.

27. The method of claim 1 in which the laser system output pulses comprise a wavelength and in which the adjacent passivation structure material, underlying passivation layer, and/or substrate is significantly absorbent to the wavelength.

28. The method of claim 27 in which the wavelength comprises a UV wavelength.

29. The method of claim 28 in which the link has a thickness of greater than 1 μm.

30. A method of controlling amplifier output of a laser fiber amplifier having saturation power characteristics at a predetermined pumping level, the saturation power characteristics limiting an amount of injection laser output that can be coupled into the laser fiber amplifier without distorting profile correlations between the injection laser output and the amplifier output, comprising:

providing, to a beam positioner, beam positioning data representing one or more locations of selected electrically conductive redundant memory or integrated circuit links having associated link structures, each link having a link width and being positioned between an associated pair of electrically conductive contacts in a circuit fabricated on either a substrate or an optional underlying passivation layer positioned between the electrically conductive link and the substrate, the substrate and any optional underlying passivation layer as associated with the link structures being characterized by respective laser damage thresholds, and the beam positioner in response to the beam positioning data imparting relative movement of a laser spot position to the substrate;

optically pumping the fiber laser amplifier at the predetermined pumping level to control gain imparted to the injection laser output injected into the laser fiber amplifier;

providing a set of at least first and second drive current pulses having respective first and second drive current profiles to an injection laser to generate an injection laser set of at least respective first and second injection laser pulses having respective first and second injection laser output profiles that correlate to the respective drive current profiles, at least the one of the first or second drive current profiles having rising and falling edges, an average power, and a pulse duration and characterized by a power spike, the power spike having a spike duration that is substantially shorter than the pulse duration, a maximum power that is greater than an average power of the laser output pulse, and a time of occurrence between the rising and falling edges to establish a specially tailored drive current profile;

coupling the first injection laser pulse into the laser fiber amplifier to provide a first amplifier output pulse having a first amplifier output profile that correlates to the first drive current profile, wherein the first drive current profile results in generation of the first injection laser pulse having power characteristics less than the saturation power characteristics of the laser fiber amplifier such that the laser fiber amplifier provides, in response to coupling the second injection laser pulse into the laser fiber amplifier, at least a second amplifier output pulse having a second amplifier output profile that correlates to the second drive current profile of the second drive current pulse;

optically converting each of the laser amplifier output pulses into a laser system output set of laser system output pulses characterized by respective laser spots having spot sizes and energy characteristics at the laser spot position, the spot sizes being larger than the link width and the energy characteristics being less than the respective laser damage thresholds of any underlying passivation layer and the substrate, the specially tailored drive current waveform thereby resulting in one of the laser output pulses having a correlated maximum power, spike duration, and time of occurrence of a power spike that cooperate to establish a specially tailored laser pulse power profile that contributes to severing of the selected link structure in the absence of operational damage to the substrate or adjacent passivation structure material; and coordinating laser system output pulse generation and the relative movement imparted by the beam positioner such that the relative movement is substantially continuous while the laser system output pulses in the laser system output set sequentially strike the selected link structure so that the spot of each laser output pulse in the laser system output set encompasses the link width and the laser system output set severs the electrically conductive link between its associated pair of electrically conductive contacts with reduced risk of causing operational damage to any underlying passivation layer and the substrate.

31. The method of claim 30, in which the power spike is coincident with the rising edge of the laser pulse temporal power profile and has a peak power value that is more than about 10% over the average power of the laser output pulse.

32. The method of claim 31, in which the power spike has a rise time and in which the rise time is shorter than about 5 ns.

33. The method of claim 32, in which the rise time is shorter than about 2 ns.

34. The method of claim 31, in which the spike duration is between about 1 ns and about 50% of the pulse duration of the laser pulse temporal power profile.

35. The method of claim 31, in which the laser pulse temporal power profile after the occurrence of the power spike is tailored to decline substantially linearly with time before the falling edge.

36. The method of claim 35, in which the total power decline after the occurrence of the power spike is more than about 10% of the average power of the laser output pulse.

37. The method of claim 31, in which the laser pulse temporal power profile after the occurrence of the power spike is relatively flat before the falling edge of the laser pulse temporal power profile.

38. The method of claim 31, in which the laser pulse temporal power profile includes an additional power spike occurring after the power spike the occurrence of which is coincident with the leading edge.

39. The method of claim 38, in which the additional power spike has a power value that is more than 5% of the average power and a spike duration of between about 1 ns and about 30% of the pulse duration of the laser pulse temporal power profile.

40. The method of claim 30, in which the power spike is in a form of an oscillating wave with a power variation of over about 10% of the average power of the laser output pulse.

41. The method of claim 40, in which the oscillating wave lasts from one-half cycle to three cycles of oscillation within the pulse duration of the laser pulse temporal power profile, and the period of the oscillation cycle is between about 1 ns and about 15 ns.

42. The method of claim 30, in which the power spike occurs at a time within an interval measured from the rising edge to 70% of the pulse duration of the laser pulse temporal power profile.

43. The method of claim 42, in which the laser pulse temporal power profile before and after the power spike is relatively flat.

44. The method of claim 42, in which the laser pulse temporal power profile before and after the power spike is not flat.

45. The method of claim 42, in which the power spike has a peak power value that is over 10% of the average power of the laser output pulse and has a spike duration that is between 1 ns and 50% of the laser pulse temporal power profile.

46. The method of claim 30, in which the adjacent passivation structure material and/or underlying passivation layer is formed from one or more of the following materials: $SiO_2$, $Si_3N_4$, SiON, a low K material, a low K dielectric material, a low K oxide-based dielectric material, an orthosilicate glass, a fluorosilicate glass, an organosilicate glass, a tetraethylorthosilicate-based oxide, methyltriethoxyorthosilicate, propylene glycol monomethyl ether acetate, a silicate ester, hydrogen silsesquioxane, methyl silsesquioxane, a polyarylene ether, benzocyclobutene, SiCOH or SiCOH-derived film, or spin on-based low K dielectric polymer.

47. The method of claim 30, in which the selected electrically conductive link structure comprises aluminum, chromide, copper, polysilicon, disilicide, gold, nickel, nickel chromide, platinum, polycide, tantalum nitride, titanium, titanium nitride, tungsten, or tungsten silicide.

48. The method of claim 30, in which each laser output pulse has laser energy of between about 0.001 microjoule and about 10 microjoules.

49. The method of claim 30, in which at least two laser output pulses are generated for removing target material aligned with locations of respective selected electrically conductive link structures at a repetition rate of greater than about 10 kHz.

50. The method of claim 30 in which a laser pulse gating device is positioned along a beam path from the fiber laser amplifier to the laser spot position on the substrate, the laser pulse gating device providing in response to control commands an output transmitting state that permits output sets of laser output pulses to propagate toward the laser spot position and an output blocking state that predominantly prevents output sets of laser output pulses from propagating toward the laser spot position, further comprising:

generating the driving sets of driving pulses at a substantially constant repetition rate in which mutually adjacent ones of the driving sets are separated from each other by generally uniform driving intervals such that amplifier sets of laser amplifier output pulses are generated at a substantially constant amplifier output repetition rate in which mutually adjacent ones of the amplifier sets are separated from each other by generally uniform amplifier output intervals; and selectively gating the amplifier sets to provide an output transmitting state to permit transmission of an output set to the laser spot position whenever it addresses a selected link structure, the laser pulse gating device providing a relatively nontransmitting state that inhibits the output set from propagating along the beam path whenever the laser spot position does not address a selected link structure.

51. The method of claim 30 in which the laser system output pulses have a wavelength about or within one of the following wavelengths or wavelength ranges: 1.54 µm, 1.3 µm, 1.1–1.06 µm, 1.05 µm, 1.047 µm, 1.03–0.75 µm, 0.65 µm, 0.53 µm, 0.5 µm, 0.43 µm, 0.35 µm, or 0.27 µm.

52. The method of claim 50 in which the link has a thickness of greater than 1 µm.

53. The method of claim 30 in which the link has a thickness of greater than 1 µm.

54. The method of claim 30 in which the laser system output pulses comprise a wavelength and in which the adjacent passivation structure material, underlying passivation layer and/or is significantly absorbent to the wavelength.

55. The method of claim 54 in which the wavelength comprises a UV wavelength.

56. The method of claim 55 in which the link has a thickness of greater than 1 µm.

* * * * *